(12) United States Patent
Gambino et al.

(10) Patent No.: US 7,598,614 B2
(45) Date of Patent: Oct. 6, 2009

(54) LOW LEAKAGE METAL-CONTAINING CAP PROCESS USING OXIDATION

(75) Inventors: Jeffrey P. Gambino, Westford, VT (US); Jason P. Gill, Essex Junction, VT (US); Sean Smith, Hopewell Junction, NY (US); Jean E. Wynne, Fair Haven, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/279,019

(22) Filed: Apr. 7, 2006

(65) Prior Publication Data

US 2007/0235875 A1 Oct. 11, 2007

(51) Int. Cl.
*H01L 23/48* (2006.01)
*H01L 23/52* (2006.01)
*H01L 29/40* (2006.01)

(52) U.S. Cl. ............... 257/751; 257/767; 257/E23.145
(58) Field of Classification Search .................. 257/767, 257/748, 751, 752
See application file for complete search history.

(56) References Cited

U.S. PATENT DOCUMENTS

| | | | |
|---|---|---|---|
| 4,231,813 A | 11/1980 | Carlin | |
| 5,695,810 A | 12/1997 | Dubin et al. | |
| 6,180,505 B1 | 1/2001 | Uzoh | |
| 6,274,935 B2 | 8/2001 | Uzoh | |
| 6,531,777 B1 * | 3/2003 | Woo et al. | 257/752 |
| 6,821,909 B2 | 11/2004 | Ramanathan et al. | |
| 2005/0089796 A1 | 4/2005 | Funatsu et al. | |
| 2005/0158656 A1 | 7/2005 | Takemoto et al. | |
| 2005/0170650 A1 * | 8/2005 | Fang et al. | 438/689 |
| 2005/0181226 A1 * | 8/2005 | Weidman et al. | 428/544 |
| 2006/0175708 A1 * | 8/2006 | Ueno | 257/774 |

OTHER PUBLICATIONS

Decorps et al., Electroless Deposition of CoWP: Material Characterization and Process Optimization on 300mm Wafers, Microelectronic Engineering, vol. 83, Issues 11-12, pp. 2082-2087 (2006).*

* cited by examiner

*Primary Examiner*—David A Zarneke
*Assistant Examiner*—Jenny L Wagner
(74) *Attorney, Agent, or Firm*—Scully, Scott, Murphy & Presser, P.C.; Richard M. Kotulak, Esq.

(57) ABSTRACT

An interconnect structure which includes a metal-containing cap located atop each conductive feature that is present within a dielectric material is provided in which a surface region of the metal-containing cap is oxidized prior to the subsequent deposition of any other dielectric material thereon. Moreover, metal particles that are located on the surface of the dielectric material between the conductive features are also oxidized at the same time as the surface region of the metal-containing cap. This provides a structure having a reduced leakage current. In accordance with the present invention, the oxidation step is performed after electroless plating of the metal-containing cap and prior to the deposition of a dielectric capping layer or an overlying interlayer or intralevel dielectric material.

11 Claims, 2 Drawing Sheets

LOW LEAKAGE METAL-CONTAINING CAP PROCESS USING OXIDATION

FIELD OF THE INVENTION

The present invention relates to a semiconductor structure and a method of fabricating the same. More particularly, the present invention relates to an interconnect structure of the single or dual damascene type in which a low leakage metal-containing cap having a surface oxide region is employed. The present invention also provides a method of fabricating such a semiconductor structure.

BACKGROUND OF THE INVENTION

Generally, semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilevel or multilayered interconnect structures, such as, for example, single or dual damascene wiring structures. Within a typical interconnect structure, metal vias run perpendicular to the semiconductor substrate and metal lines run parallel to the semiconductor substrate.

Copper (Cu)-based interconnects have gained wide acceptance in the microelectronics industry due to improved resistivity and reliability as compared to aluminum (Al)-based interconnects. However as devices shrink, the wiring capacitance becomes an increasingly large percentage of the overall capacitance, resulting in increased signal delay, power consumption and noise. Therefore low k dielectrics (having a dielectric constant of less than silicon dioxide) are becoming more of the mainstream for 90 nm technology node and beyond.

Unfortunately, the effective dielectric constant of such interconnects is higher than that of the low k dielectric due to the presence of dielectric capping layers such as, for example, SiN or SiC, that are typically used to passivate the Cu surfaces.

Recently, it has been shown that the circuit delay can be reduced by using a self-aligned CoWP cap instead of a dielectric capping layer in such interconnect structures. See, for example, T. Ko et al. entitled "High Performance/Reliability Cu Interconnect with Selective CoWP Cap", VLSI Symp. Proc. 2003, p. 109. The CoWP cap is formed selectively on Cu-containing features using electroless plating, the details of which, can be found, for example, in A. Kohn et al. entitled "Characterization of electroless deposited Co(W,P) thin films for encapsulation of copper metallization", Mater. Sci. Eng. A, 302, 18 (2001) and C.-K Hu et al. entitled "Reduced Cu interface diffusion by CoWP surface coating" Microelec. Eng. 70, 406 (2003).

Despite the advances in using CoWP caps, it is still unclear whether a CoWP cap by itself (without an overlying dielectric cap) can provide an adequate barrier during oxidizing processes such as, for example, dielectric deposition and resist stripping. During the dielectric deposition of oxide-based dielectrics by plasma enhanced chemical vapor deposition, the CoWP cap is exposed to an oxidizing ambient at temperatures of from 350° to 400° C. Both Cu and Co are known to oxidize at low temperatures (e.g., less than 400° C.).

J. Gambino et al. "Thermal Oxidation of Cu interconnects capped with CoWP", Materials, Technology, and Reliability of Advanced Interconnects-2005, MRS Proc., Vol. 863, 2005, p. 227 provides an investigation of thermal oxidation of Cu interconnects including a CoWP cap. It is reported herein that CoWP is not a good barrier from thermal oxidation since it destroys the Cu interconnect.

Moreover, although the deposition of CoWP utilizing an electroless process is selective to the Cu-containing features, metal particles are formed on the surface of the dielectric material that is between the Cu-containing features. The presence of the metal particles or residues between the conductive features leads to high leakage currents (the leakage with CoWP is about ten times or higher compared to similar structures with no CoWP) and poor reliability.

In view of the above, there is a need for providing a metal cap for a conductive feature which does not increase the leakage current of the interconnect structure, while avoiding the drawbacks mentioned in the Gambino et al. reference mentioned above.

SUMMARY OF THE INVENTION

The present invention provides an interconnect structure which includes a metal-containing cap located atop each conductive feature that is present within a dielectric material. In accordance with the present invention, a surface region of the metal-containing cap is oxidized prior to the subsequent deposition of any other dielectric material thereon. Moreover, metal particles that are located on the surface of the dielectric material between the conductive features can also be oxidized at the same time as the surface region of the metal-containing cap. This provides a structure having a reduced leakage current. In accordance with the present invention, the oxidation step is performed after electroless plating of the metal-containing cap and prior to the deposition of a dielectric capping layer and/or an overlying interlayer or intralevel dielectric material.

In general terms, the present invention provides an interconnect structure comprising:

a dielectric material having at least one conductive feature embedded therein, said at least one conductive feature having a surface that is coplanar with an upper surface of the dielectric material;

a metal-containing cap disposed on said at least one conductive feature, said metal-containing cap having an oxidized surface region; and oxidized metal particles located on said surface of said dielectric material between said at least one conductive feature.

The inventive interconnect structure may further include a dielectric capping layer and/or another dielectric material covering at least said oxidized metal particles and said metal-containing cap.

In a preferred embodiment of the present invention, an interconnect structure is provided that includes:

a dielectric material having at least one Cu-containing conductive feature embedded therein, said at least one Cu-containing conductive feature having a surface that is coplanar with an upper surface of the dielectric material;

a CoWP or CoP cap disposed on said at least one conductive feature, said CoWP or CoP having an oxidized surface region; and oxidized Co particles located on said surface of said dielectric material between said at least one Cu-containing conductive feature.

This inventive interconnect structure may further include a dielectric capping layer and/or another dielectric material covering at least said oxidized Co particles and said CoWP or CoP cap.

In addition to the interconnect structure mentioned above, the present application also provides a method of fabricating the same. In general terms, the method of the present invention includes:

providing a structure including a dielectric material having at least one conductive feature embedded therein, said at least one conductive feature having a surface that is coplanar with an upper surface of the dielectric material;

disposing a metal-containing cap on said at least one conductive feature by electroless plating, wherein during said electroless plating metal particles form on the surface of the dielectric material that is located between the at least one conductive feature; and oxidizing said metal-containing cap to form an oxidized surface region thereon, while completely oxidizing said metal particles, with the proviso that said oxidizing occurs prior to deposition of an overlying dielectric (e.g., dielectric cap and/or interlevel or intralevel dielectric material).

DETAILED DESCRIPTION OF THE INVENTION

The present invention, which provides an interconnect structure including a low leakage metal-containing cap atop conductive features as well as a method of fabricating the same, will now be described in greater detail by referring to the following discussion and drawings that accompany the present application. It is noted that the drawings of the present application are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

Moreover, although the present invention specifically contemplates the low leakage metal-containing cap as an element of an interconnect structure, the same can be used as a cap for a transistor or a capacitor.

Figure 1:
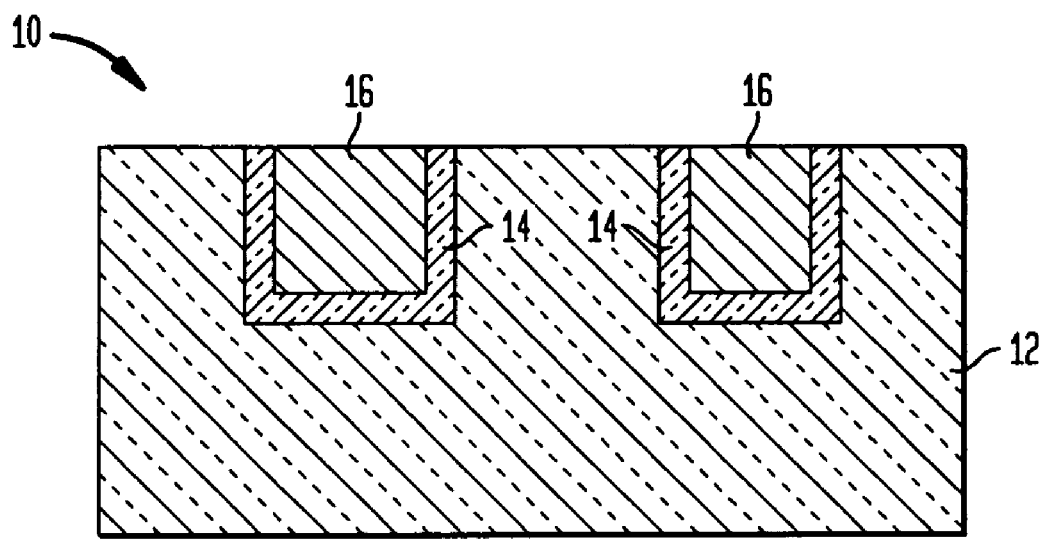
FIG. 1 is a pictorial representation (through a cross sectional view) illustrating an initial interconnect structure that can be employed in the present invention.

Reference is first made to FIG. 1 which illustrates an initial interconnect structure 10 that can be employed in the present invention. The initial interconnect structure 10 includes a first dielectric material 12 having one or more conductive features 16 embedded in the first dielectric material 12. As shown, a diffusion barrier 14 is positioned between the one or more conductive features 16 and the first dielectric material 12.

The initial interconnect structure 10 shown in FIG. 1 is made utilizing standard interconnect processing which is well known in the art. For example, the initial interconnect structure 10 can be formed by first applying the first dielectric material 12 to a surface of a substrate (not shown). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

The first dielectric material 12 may comprise any interlevel or intralevel dielectric including inorganic dielectrics or organic dielectrics. The first dielectric material 12 may comprise a single dielectric material or a multilayered stack of dielectric materials. The first dielectric material 12 may be porous or non-porous. Some examples of suitable dielectrics that can be used as the first dielectric material 12 include, but are not limited to: $SiO_2$, silsesquixoanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first dielectric material 12 typically has a dielectric constant that is about 4.0 or less, with a dielectric constant of about 2.8 or less being even more typical. These dielectrics generally have a lower parasitic crosstalk as compared with dielectric materials that have a higher dielectric constant than 4.0. The thickness of the first dielectric material 12 may vary depending upon the dielectric material used as well as the exact number of dielectrics being deposited. Typically, and for normal interconnect structures, the first dielectric material 12 has a thickness from about 200 to about 450 nm.

The first dielectric material 12 has at least one conductive feature 16 that is embedded (i.e., located within) therein. The at least one conductive feature 16 comprises a conductive material that is separated from the first dielectric material 12 by a diffusion barrier 14. The conductive feature 16 and diffusion barrier 14 are formed by lithography (i.e., applying a photoresist to the surface of the first dielectric material 12, exposing the photoresist to a desired pattern of radiation, and developing the exposed resist utilizing a conventional resist developer), etching (dry etching or wet etching) an opening in the first dielectric material 12 and filling the etched region with the diffusion barrier 14 and then with a conductive material forming the conductive features 16. The diffusion barrier 14, which may comprise Ta, TaN, Ti, TiN, Ru, RuN, W, WN or any other material that can serve as a barrier to prevent conductive material from diffusing there through, is formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the diffusion barrier 14 may vary depending on the exact means of the deposition process as well as the material employed. Typically, the diffusion barrier 14 has a thickness from about 4 to about 40 nm, with a thickness from about 7 to about 20 nm being more typical.

Following the diffusion barrier 14 formation, the remaining region of the opening within the first dielectric material 12 is filled with a conductive material forming the at least one conductive feature 16. The conductive material used in forming the at least one conductive feature 16 includes, for example, polySi, a conductive metal, an alloy comprising at least one conductive metal, a conductive metal silicide or combinations thereof. Preferably, the conductive material that is used in forming each of the conductive features 16 is a conductive metal such as Cu, W or Al, with Cu or a Cu alloy (such as AlCu) being highly preferred in the present invention. The conductive material is filled into the remaining opening in the first dielectric material 12 utilizing a conventional deposition process including, but not limited to: CVD, PECVD, sputtering, chemical solution deposition or plating. After deposition, a conventional planarization process such as, for example, chemical mechanical polishing (CMP) can be used to provide a structure in which the diffusion barrier 14 and the at least one conductive feature 16 each have an upper surface that is substantially coplanar with the upper surface of the first dielectric material 12.

It should be noted that the at least one conductive feature 16 may be a via, a line or a via and line combination in which the via is located beneath the line.

Figure 2:
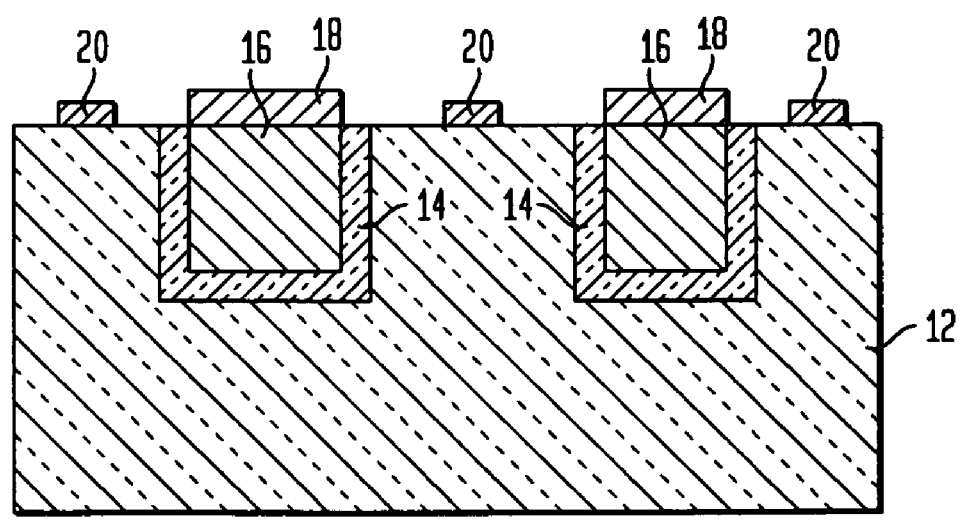
FIG. 2 is a pictorial representation (through a cross sectional view) of the structure shown in FIG. 1 after selective deposition of a metal-containing cap.

FIG. 2 shows the structure after forming a metal-containing cap 18 selectively atop the exposed portions of the at least one conductive features 16. Specifically, the metal-containing cap 18 is formed by electroless plating, which process is well known to those skilled in the art. In some embodiments, portions of the metal-containing cap 18 can extend atop the diffusion barrier 14 as well. Typically, however, the metal-containing cap 18 is self-aligned with the underlying at least one conductive feature 16. That is, the metal-containing cap 18 has outer edges that are aligned to the outer edges of the underlying at least one conductive feature 16. As shown, metal particles 20 form atop exposed surfaces of the first dielectric material 12 during the selective formation of the metal-containing cap 18. The presence of the metal particles 20 is unwanted since they lead to a structure having high leakage currents and poor reliability. It should be noted that the size and shape of the metal particles 20 located between the at least one conductive feature 16 is exaggerated in the drawings of the present application.

The metal-containing cap 18 and the metal particles 20 comprise elemental Co alone, elemental Co and at least one of P or B, elemental Ni alone, or elemental Ni and at least one of P or B. Optionally, W may also be used. Thus, the present invention provides a metal-containing cap 18 that includes one of Co, CoP, CoWP, CoB, CoWB, Ni, NiP, NiWP, NiB, or NiWB. Of these materials, CoP or CoWP are preferred materials for the metal-containing cap 18.

The thickness of the metal-containing cap 18 may vary depending on the exact conditions of the electroless deposition process employed. In general, the thickness of the metal-containing cap 18 is from about 1 to about 20 nm, with a thickness from about 4 to about 10 nm being even more typical. The metal particles 20 that are present on the first dielectric material 12 between the conductive features 16 are comprised of an agglomerate of particles whose size and shape are not critical to the present invention.

Metal deposition by electroless plating is well practiced in industry. In an electroless deposition process, a redox reaction involving the oxidation of one or more soluble reducing agent(s) and the reduction of one or more metallic ions occurs on the surface of a substrate. For many metals including Cu, Ni, Co, Au, Ag Pd, Rh, the freshly deposited surface is sufficiently catalytic for the process to continue.

In electroless plating, activation of a surface, non conductive, or semiconductor can be achieved by the incorporation onto the top surface layer of nanometer sized catalytic particles. These catalytic particles can be either Pd, Co, Ni, and they can be applied by a either physical or chemical deposition.

The function of these particles is to catalyze and initiate the electrochemical deposition reaction when the substrate is immersed into an electroless plating bath. The electroless plating bath deposits a conductive layer on the catalyzed area of the substrate, the thickness of the plating layer depending mainly on the time of exposure to the plating bath. A suitable electroless plating system used in this invention is based on the use of the hypophosphite reducing agent. In this system, a mixture of hypophosphite ions and cobalt ions is made together with citrate stabilizing agent, at a suitable pH and temperature (usually between 65° to 75° C.). When the activated catalyzed substrate described above is immersed on this plating bath, the following reaction occurs on the substrate:

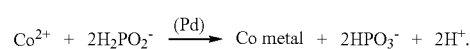

$$Co^{2+} + 2H_2PO_2^- \xrightarrow{(Pd)} Co\ metal + 2HPO_3^- + 2H^+. \quad a$$

The metal is then deposited selectively on top of the catalyzed Pd layer on the substrate. The metal deposited by this reaction can include any of the metal-containing materials mentioned above, with CoP or CoWP being highly preferred, depending on the composition of the plating bath solution. The catalytic layer can be either Pd, Co or Ni metal. The catalytic layer can be incorporated on the surface of the substrate either by ion implantation, or other type of physical deposition method, or it can be applied by chemical means. For example, a colloidal catalytic solution containing microparticles of catalyst in suspension can be injected in onto the at least one conductive feature 16 and it will deposit the catalytic particles with very good adhesion to the at least one conductive features 16.

At this point of the present invention, an oxidation process is performed which converts a surface region of the metal-containing cap 18 atop the at least one conductive feature 16 into an oxidized surface region 22. During this oxidation, the metal particles 20 between the conductive features 16 that are located on the first dielectric material 12 are completely oxidized into oxide particles 24. The resultant structure that is formed after this oxidation process has been performed in shown, for example, in FIG. 3. As shown, the oxidation partially oxides the metal-containing cap 18 at the surface thereof, while completely oxidizing the undesired metal particles 22. It is noted that this oxidation step is performed prior to the deposition of an optional dielectric capping layer as well as an optional second dielectric material. It is further noted that the oxidation step of the present invention differs from the oxidation step employed in the Gambino et al. reference mentioned in the background section of this application. Unlike the Gambino et al. reference in which the oxidation conditions completely oxidized the CoWP cap, the oxidation step of the present invention oxidizes less than 5 nm of the metal-containing cap 18, with less than 2 nm being more preferred.

In accordance with the present invention, oxidation may be performed utilizing thermal oxidation, plasma oxidation, wet chemical oxidation or any combination thereof. When a thermal oxidation is performed, the thermal oxidation is performed at a temperature from about 300° to about 450° C., with a temperature from about 350° to about 400° C. being more preferred. The thermal oxidation is performed in an oxygen-containing gas in which the oxygen pressure is from about 0.001 to about 760 torr, with an oxygen pressure from about 0.1 to about 1.0 torr being more preferred. The oxygen-containing gas includes molecular oxygen, atomic oxygen, ozone, NO, $H_2O$, $N_2O$ and mixtures thereof. In some embodiments, the oxygen-containing gas may be admixed with an inert gas such as, for example, He, Ar, Ne or mixtures thereof. The duration of the thermal oxidation process used in the present invention is typically from about 5 to about 200 seconds, with a duration of about 20 to about 50 seconds being more preferred.

When a plasma oxidation is performed, a plasma is generated from one of the above mentioned oxygen-containing gases utilizing processes well known to those skilled in the art. The oxygen plasma is a neutral, highly ionized oxygen-containing gas that consisting of neutral atoms or molecules, positive ions and free electrons. Ionization of the oxygen-containing gas is typically carried out in a reactor chamber in which the ionization process is achieved by subjecting the oxygen source to strong DC or AC electromagnetic fields. Alternatively, the ionization of the oxygen-containing gas is performed by bombarding the gate atoms with an appropriate electron source.

The plasma oxidation process that can be utilized in the present invention is performed at a temperature from about 20° to about 300° C., with a temperature from about 22° to about 40° C. being more preferred. The flow of oxygen-containing gas into the reactor is typically from about 10 to about 1000 sccm, with a flow of about 100 to about 250 sccm being more preferred. The pressure of the oxygen plasma process utilized in the present invention is from about 0.0001 to about 2 torr, with a pressure from about 0.01 to about 0.5 torr being more preferred. The duration of the oxygen plasma process is from about 5 to about 200 seconds, with a duration of from about 20 to about 50 seconds being more preferred.

When a wet chemical oxidation process is employed, an oxidizing agent is used that is capable of converting a surface region of the metal-containing cap 18 into an oxidized surface region 22, while completely converting the metal particles 20 to metal oxide particles 24. Suitable oxidizing agents that can be employed in the present invention include, but are not limited to: a 1:1 mixture of $H_2O$ and $H_2O_2$.

In accordance with the present invention, the wet chemical oxidation process is performed at a temperature from about 20° to about 80° C., with a temperature from about 25° to about 40° C. being more preferred. The wet chemical oxidation is performed for a time period from about 10 to about 200 seconds, with a time period from about 20 to about 50 second being more preferred.

It is noted that the oxidation of the metal particles 20 between the at least one conductive features 16 at this point of the present invention reduces the leakage currents caused by such metal particles to values that are less than those obtained if they same were oxidized by subsequent dielectric deposition. The leakage current can be reduced by an amount of about ten times or greater as compared to those structures in which the same metal particles were oxidized by subsequent depositions.

Figure 3:
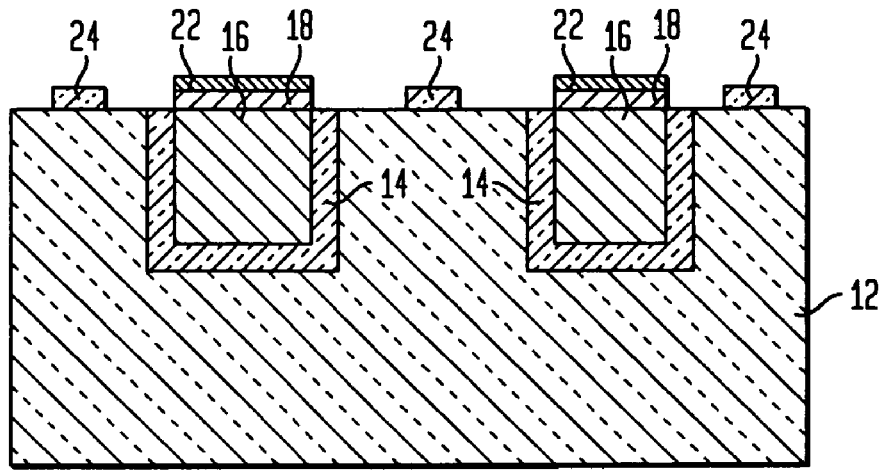
FIG. 3 is a pictorial representation (through a cross sectional view) of the structure shown in FIG. 2 after oxidation.

After performing oxidation, a dielectric capping layer 26 is typically, but not necessarily always, formed on the surface of the structure shown in FIG. 3 utilizing a conventional deposition process such as, for example, CVD, PECVD, chemical solution deposition, or evaporation. The dielectric capping layer 26 comprises any suitable dielectric capping material such as, for example, SiC, $Si_4NH_3$, $SiO_2$, a carbon doped oxide, a nitrogen and hydrogen doped silicon carbide SiC(N, H) or multilayers thereof. The thickness of the dielectric capping layer 26 may vary depending on the technique used to form the same as well as the material make-up of the layer. Typically, the dielectric capping layer 26 has a thickness from about 15 to about 55 nm, with a thickness from about 25 to about 45 nm being more typical.

Figure 4:
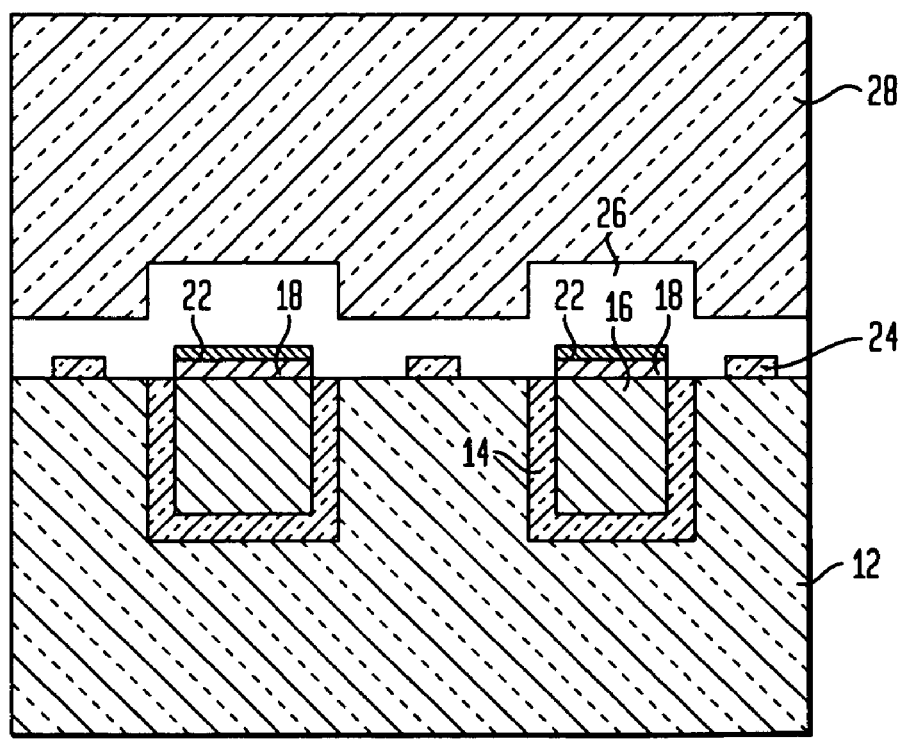
FIG. 4 is a pictorial representation (through a cross sectional view) of the structure shown in FIG. 3 after formation of a dielectric cap and a second dielectric material.

Next, a second dielectric material 28 is optionally formed atop the upper exposed surface of the dielectric capping layer 26, if present, or atop the structure shown in FIG. 3. The resultant multilevel interconnect structure including the dielectric capping layer 26 and the second dielectric material 28 is shown, for example, in FIG. 4. In cases when the structure shown in FIG. 3 is the uppermost level of the interconnect structure, a second dielectric material is not needed. The second dielectric material 28 may comprise the same or different, preferably the same, dielectric material as that of the first dielectric material 12. The processing techniques and thickness ranges for the first dielectric material 12 are also applicable here for the second dielectric material 28.

Conventional interconnect processing techniques can be now performed to form conductive regions embedded in the second dielectric material 28. These additional conductive features can be separated from the second dielectric material 28 by at least another diffusion barrier liner. An optional metal seed layer may also be present. After forming the other conductive features in the second dielectric material 28, the above mentioned processing steps of metal-capping layer deposition and oxidation can be performed.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An interconnect structure comprising:
    a dielectric material having at least one conductive feature embedded therein, said at least one conductive feature having a surface that is coplanar with an upper surface of the dielectric material;
    a metal-containing cap having a thickness from about 1 to about 20 nm disposed on said at least one conductive feature, said metal-containing cap having an oxidized surface region having a thickness that is less than 5 nm located upon an unoxidized lower region, wherein an outer edge of the metal-containing cap is aligned to an outer edge of the at least one conductive feature; and
    completely oxidized metal particles located on said surface of said dielectric material adjacent said at least one conductive feature.

2. The interconnect structure of claim 1 wherein said dielectric material is one of $SiO_2$, a silsesquioxane, a C doped oxide that includes atoms of Si, C, O and H, or a thermosetting polyarylene ether.

3. The interconnect structure of claim 1 wherein said at least one conductive feature is a via, a line or a combination thereof.

4. The interconnect structure of claim 1 wherein said at least one conductive feature comprises Cu, W, Al or alloys thereof.

5. The interconnect structure of claim 4 wherein said at least one conductive feature comprises Cu or a Cu-containing alloy.

6. The interconnect structure of claim 1 wherein said at least one conductive feature is separated in part from said dielectric material by a diffusion barrier.

7. The interconnect structure of claim 1 wherein said metal-containing cap comprises elemental Go, elemental Ni, CoP, CoWP, CoB, CoWB, NiP, NiWP or NiWB.

8. The interconnect structure of claim 7 wherein said metal-containing cap comprises CoWP or CoP.

9. The interconnect structure of claim 1 further comprising at least one other dielectric material covering said metal-containing cap and said oxidized metal particles, wherein said at least one other dielectric material comprises one of a dielectric capping layer, or a second dielectric material that is the same or different from said dielectric material including said at least one conductive feature embedded therein.

10. An interconnect structure comprising:
a dielectric material having at least one Cu-containing conductive feature embedded therein, said at least one Cu-containing conductive feature having a surface that is coplanar with an upper surface of the dielectric material;
a CoWP or CoP cap having a thickness from about 1 nm to about 20 nm disposed on said at least one conductive feature, said CoWP or CoP having an oxidized surface region having a thickness that is less than 5 nm located upon an unoxidized lower region, wherein an outer edge of the CoWP or CoP cap is alianed to an outer edae of the at least one Cu-containing conductive feature; and completely oxidized Co particles located on said surface of said dielectric material adjacent said at least one Cu-containing conductive feature.

11. The interconnect structure of claim 10 further comprising at least one other dielectric material covering said CoWP of CoP cap and said oxidized Co particles, wherein said at least one other dielectric material comprises one of a dielectric capping layer or a second dielectric material that is the same or different from said dielectric material including said at least one Cu-containing conductive feature embedded therein.

\* \* \* \* \*